Aug. 23, 1966 R. V. QUINLAN 3,268,829

COMMON-EMITTER TRANSISTOR DIFFERENTIAL AMPLIFIER

Filed Aug. 30, 1963 2 Sheets-Sheet 1

INVENTOR
R. V. QUINLAN
BY Z. W. Adams, Jr.
ATTORNEY 3,268,829

COMMON-EMITTER TRANSISTOR DIFFERENTIAL AMPLIFIER

Robert V. Quinlan, Fort Wayne, Ind., assignor to Bell Telephone Laboratories, Incorporated, New York, N.Y., a corporation of New York Filed Aug. 30, 1963, Ser. No. 305,758
7 Claims. (Cl. 330—30)

This invention relates to differential amplifiers and, more particularly, to a transistor differential amplifier circuit exhibiting an optimum common-mode rejection ratio.

A differential amplifier has many applications. One of its most prevalent applications is in sensitive measuring and control equipment to produce a single-ended output signal representative of the difference between two input signals. In the communications field, the differential amplifier is used to commence and terminate balanced, two-wire transmission lines. In this application, the differential amplifier is capable of removing spurious currents induced during transmission on the line.

For the purpose of analysis of the performance of a differential amplifier, the single-ended output is expressed in terms of two components—a component resulting from a common-mode input signal, i.e., the average of the two input signals, and a component resulting from a differential-mode input signal, the difference between the two input signals. In virtually every application of a differential amplifier, the aim is to preserve the differential-mode component of the output and suppress the common-mode component. In fact, a commonly-employed figure of merit measuring the performance of a differential amplifier is the common-mode rejection ratio, defined as the component of the differential amplifier output attributable to the common-mode input signal divided by the component of the differential amplifier output attributable to the differential-mode input signal.

It has long been known that to realize the best possible common-mode rejection ratio in a vacuum tube differential amplifier of the usual design comprising two tubes whose cathodes are connected together and coupled to ground by a common resistor, the common cathode resistor should be as large as is possible, without impeding the plate operating current. Thus, no well-defined optimum common-mode rejection ratio is obtainable in vacuum tube differential amplifier design because no matter how large the resistance of the common, cathode resistor, the common-mode rejection ratio can be improved by increasing the resistance of the common, cathode resistor, assuming that measures are taken not to impede the plate operating current. This principle has generally been thought to be equally applicable in the design of a transistor differential amplifier.

It is, therefore, the object of the present invention to improve the common-mode rejection ratio in the transistor differential amplifier and, more particularly, to find a design criterion for such an amplifier resulting in an optimum common-mode rejection ratio.

In accordance with this object, a conventionally-arranged differential amplifier is provided comprising first and second transistors having substantially matched characteristics. Each transistor is connected in the common-emitter configuration and shares in common with the other transistor, a resistor as part of its emitter circuit. The shared emitter resistor is selected so that the voltage gain from the base of the first transistor to the collector of the second transistor is equal and opposite to the voltage gain from the base of the second transistor to the collector of the second transistor. The resistance of the shared emitter resistor required to satisfy this condition is substantially equal to $$ar_c/2$$

where $a$ is the equivalent-T common-base current-amplification factor and $r_c$ is the equivalent-T collector resistance of each transistor. Satisfaction of this criterion for the selection of the shared emitter resistor results in an optimum common-mode rejection ratio.

According to a feature of the invention, the shared emitter resistor takes the form of two transistors connected in tandem between the emitters of the first and second transistors and ground. This arrangement functions to present a value of dynamic resistance, i.e., resistance to incremental or varying currents caused by the amplifier input signal, substantially equal to $$ar_c/2$$

in the common emitter circuit while creating more favorable quiescent operating conditions for the first and second transistors.

These and other features of the invention will become apparent from consideration of the following detailed description taken in conjunction with the drawings in which.

Figure 1:
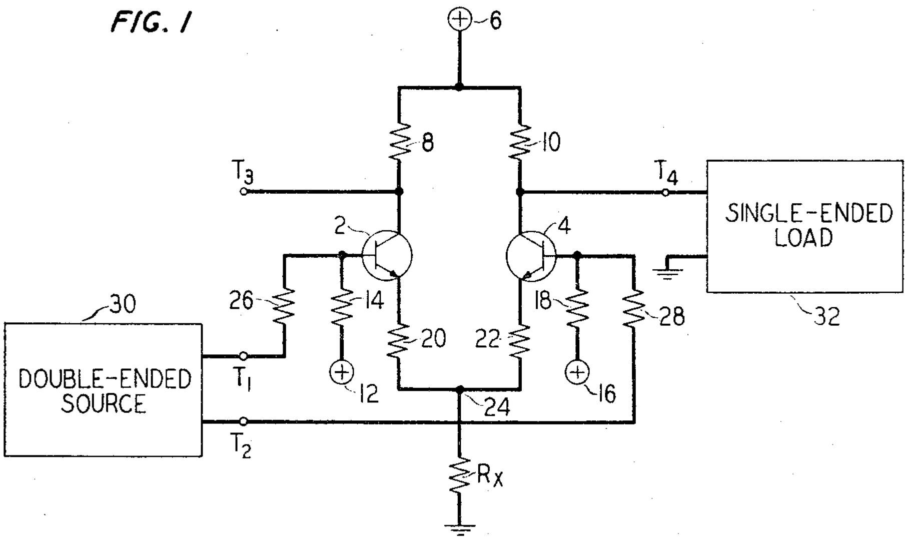
FIG. 1 shows a transistor differential amplifier connected in the common-emitter configuration.

FIG. 1 discloses a differential amplifier comprising transistors 2 and 4 connected in the common-emitter configuration. Bias from a source of positive potential 6 is provided to the collectors of transistors 2 and 4 through individual resistors 8 and 10, respectively. Bias is provided from a source of positive potential 12 through a resistor 14 to the base of transistor 2 and from a source of positive potential 16 through resistor 18 to the base of transistor 4. Individual emitter resistors 20 and 22 connect transistors 2 and 4, respectively, to a common node 24. A resistor $R_x$, shared by the emitter circuits of transistors 2 and 4 in common, is connected between node 24 and ground. Input terminals $T_1$ and $T_2$ are coupled to the base of transistor 2 and the base of transistor 4, respectively, by resistors 26 and 28, respectively. Connected to the collectors of transistors 2 and 4 are output terminals $T_3$ and $T_4$, respectively. For the purpose of the following analysis, transistors 2 and 4 are assumed to have matched characteristics and corresponding components associated with each transistor are assumed to be identical in value.

The differential amplifier circuit of FIG. 1 can be used to convert a double-ended input signal to a single-ended output signal, as for example, to terminate a balanced, two-wire transmission line or to measure the difference between two input signals. In this case the terminals of a double-ended signal source such as 30 are connected to terminals $T_1$ and $T_2$, as shown in the drawing, and the terminals of a single-ended load such as 32 are connected either to output terminal $T_4$ and ground, as shown in the drawing, or to output terminal $T_3$ and ground. Conversely, the same amplifier circuit can be employed to convert a single-ended input signal to a double-ended output signal, as for example at the beginning of a balanced, two-wire transmission line. In this case, a single-ended input signal is applied either to terminal $T_1$ or $T_2$, and the balanced or push-pull output appears across terminals $T_3$ and $T_4$. The amplifier circuit, used in this application, is sometimes called a paraphase amplifier. However, as used herein the term, "differential amplifier" refers to the amplifier circuit of FIG. 1 used either to convert from a single-ended input to a double-ended output or to convert from a double-ended input to a single-ended output. To whichever of these applications the amplifier circuit of FIG. 1 is put, its performance is measurable in terms of the common-mode rejection ratio. The importance of the common-mode rejection ratio is illustrated by considering a differential amplifier having a common-mode rejection ratio of .001 and being employed to indicate in terms of the voltage across its output the difference between two input signals. Under these conditions, one-volt signals of the same polarity applied to both terminals $T_1$ and $T_2$ produce the same output voltage as a one millivolt difference in voltage between terminals $T_1$ and $T_2$. Thus, the common-mode rejection ratio of a differential amplifier is a measure of the uncertainty and error occurring in its operation.

The common-mode rejection ratio can be expressed as $$CMR=\frac{2(K_1+K_2)}{K_1-K_2} \qquad (1)$$

where $K_1$ is the voltage gain from input terminal $T_1$ to output terminal $T_4$ and $K_2$ is the voltage gain from input terminal $T_2$ to output terminal $T_4$. (Since both halves of the differential amplifiers are matched, the voltage gain from input terminal $T_2$ to output terminal $T_3$ also equals $K_1$ and the voltage gain from input terminal $T_1$ to output terminal $T_3$ also equals $K_2$.) It can be seen from Equation 1 that the common-mode rejection ratio becomes optimum, ideally zero, when $K_1$ and $K_2$ are equal and opposite.

For determining the voltage gain from terminal $T_1$ to terminal $T_4$, transistor 2 is considered to operate as a common-collector stage and transistor 4 is considered to operate as a common-base stage connected in tandem therewith. Shared emitter resistor $R_x$ is shunted across the input of transistor 4, reducing the current applied thereto from transistor 2. The total gain expression from terminal $T_1$ to terminal $T_4$ is $$K_1=\frac{R_LR_x(ar_c+r_b+R_g)(r_c+R_L)}{B(r_c+R_L+r_b+R_g)(R_x+R_e+R_o)} \qquad (2)$$

where $R_L$ is the resistance of resistors 8 and 10, $R_x$ is the resistance of the shared emitter resistor between node 24 and ground, $a$ is the value of the equivalent-T common-base current-amplification factor of transistors 2 and 4, $r_c$ is the equivalent-T collector resistance of transistors 2 and 4, $r_b$ is the equivalent-T base resistance of transistors 2 and 4, $R_g$ is the combined resistance of resistor 26 connected in parallel with resistor 14 plus the resistance of source 12 and resistor 28 connected in parallel with resistor 18 plus the resistance of source 16, and $R_e$ is the resistance of resistors 20 and 22. Also, in Equation 2, $$R_o=r_e+(r_b+R_g)\frac{r_c(1-a)+R_L}{r_c+R_L+r_b+R_g} \qquad (3)$$

the output resistance of transistor 2, and $$B=(r_b+R_g)\left[r_c(1-a)+R_L+r_e+R_e+\frac{R_x(R_e+R_o)}{R_x+R_e+R_o}\right]+(r_c+R_L)\left[r_e+R_e+\frac{R_x(R_e+R_o)}{R_x+R_e+R_o}\right] \qquad (4)$$

where, in addition, $r_e$ is the equivalent-T emitter resistance of transistors 2 and 4.

For determining the voltage gain from terminal 2 to terminal 4, transistor 2 and resistor $R_x$ are viewed as parallel resistances in the emitter circuit of transistor 4, which operates as a single stage common-emitter amplifier. The gain expression from terminal $T_2$ to terminal $T_4$ is $$K_2=-\frac{R_L\left[ar_c-r_e-R_e-\frac{R_x(R_e+R_i)}{R_x+R_e+R_i}\right]}{B} \qquad (5)$$

where the terms are defined as above and $R_i$ is the input resistance of transistor 2 in the common-base configuration and is equal to $R_o$.

As previously stated, an optimum common-mode rejection ratio results when the numerator of Equation 1 is zero. Thus, equating the sum of $K_1$ and $K_2$ to zero and solving for the resistance of the shared emitter resistor yields $$R_{x_o}=\frac{(R_e+R_i)(ar_c-r_e-R_e)}{2R_e+R_i+r_e+(r_b+R_g)\frac{r_c(1-a)+R_L}{r_c+R_L+r_b+R_g}} \qquad (6)$$

which reduces to $$R_{x_o}=\frac{ar_c-r_e-R_e}{2} \qquad (7)$$

To this point in the analysis, the only simplifying assumption made was that the low-frequency, equivalent-T transistor parameters define the transistor's operation. In practice, $ar_c>>r_e$ and $R_e$. Thus, Equation 7 can be simplified to $$R_{x_o}\approx\frac{ar_c}{2} \qquad (8)$$

Figure 3:
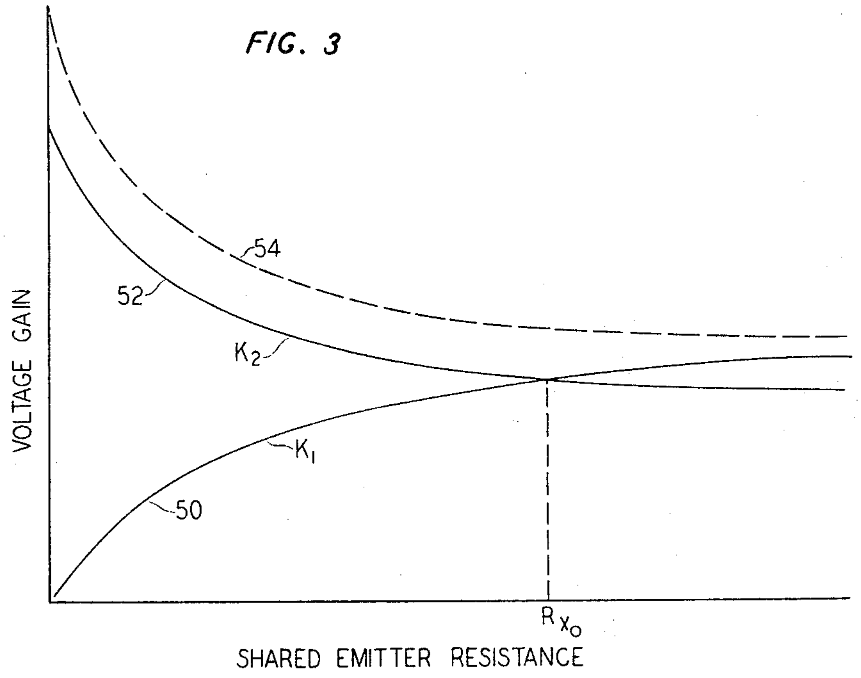
FIGS. 3 and 4 are graphs illustrating the operation of the differential amplifier of FIG. 1 as a function of the resistance of the shared emitter resistor.
Figure 4:
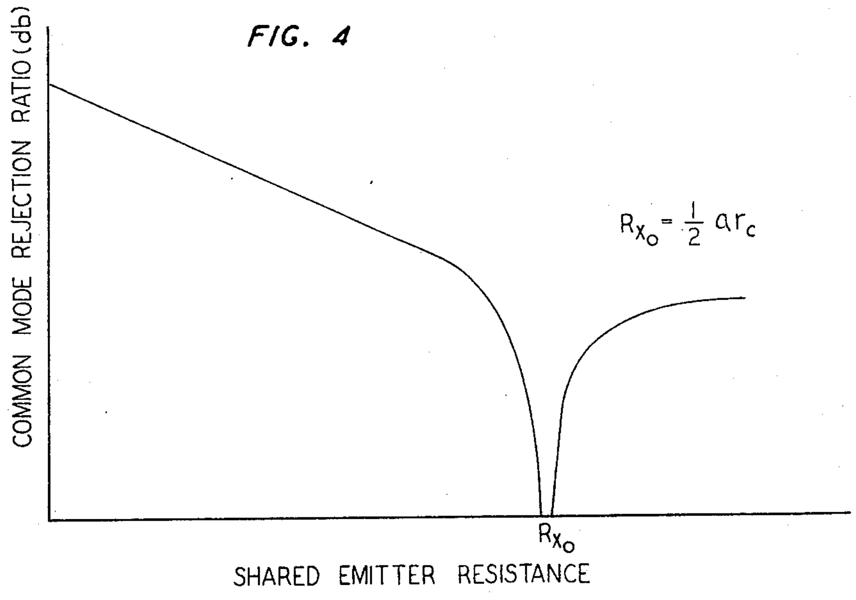

The effect of the resistance of shared emitter resistor $R_x$ on the operation of the differential amplifier will now be considered qualitatively. As $R_x$ increases, the magnitude of the gain $K_1$ from terminal $T_1$ to terminal $T_4$ increases because less current is shunted through resistor $R_x$ and, consequently, more current is applied to the emitter of transistor 4. The relationship between the resistance of the shared emitter resistor $R_x$ and the magnitude of the voltage gain $K_1$ is illustrated by curve 50 in FIG. 3. Concurrently as $R_x$ increases, the magnitude of the gain $K_2$ from terminal $T_2$ to terminal $T_4$ decreases, because more negative feedback results from the increase in the total resistance in the emitter circuit of transistor 4. The relationship between the ristance of the shared emitter resistor $R_x$ and the magnitude of the voltage gain $K_2$ is illustrated by curve 52 in FIG. 3. As the magnitude of the voltage gain $K_1$ increases and the magnitude of the voltage gain $K_2$ decreases, a point is reached where the two become equal. At the resistance $R_{x_0}$ of the shared emitter resistor corresponding to this point, the value of the common-mode rejection ratio becomes zero. This is shown in FIG. 4, which is a graph of common-mode rejection ratio as a function of resistance of $R_x$.

It is not possible to achieve an optimum common-mode rejection ratio, as described in connection with a common-emitter transistor differential amplifier, in either a vacuum tube differential amplifier or a common-base transistor differential amplifier, because the terminal characteristics of these devices make it impossible to equate the magnitudes of the gains $K_1$ and $K_2$. In these devices, the magnitudes of the gains $K_1$ and $K_2$ approach equality asymptotically at an infinite resistance of the shared emitter resistor, as represented in FIG. 3 by curve 50 and a dashed curve 54, displaced upwardly from curve 52.

Figure 2:
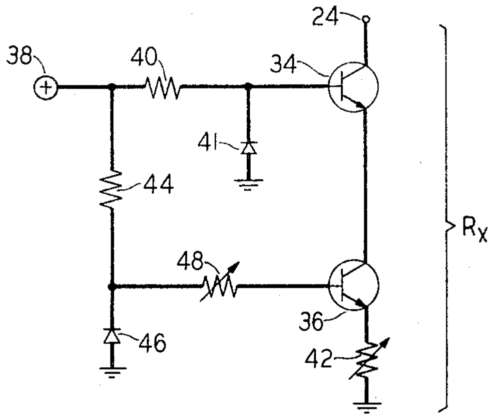
FIG. 2 shows a shared emitter network that may be substituted for the shared emitter resistor in the amplifier of FIG. 1.

The equivalent-T collector resistance of a typical transistor is of the order of two megohms. The equivalent-T common-base current-amplification factor is of the order of unity. Thus, Equation 8 indicates that $R_x$ typically is of the order of one megohm. Under most circumstances use of a simple resistor of such a large value in the emitter circuit would unduly impede the transistor operating current. Conveniently, the shared emitter network of FIG. 2 may be substituted for resistor $R_x$, shown in FIG. 1. The shared emitter network of FIG. 2 is capable of presenting a dynamic resistance, i.e., resistance to incremental or varying currents caused by the signal applied to the differential amplifier input terminals, between node 24 and ground of the prescribed value to produce an optimum common-mode rejection ratio, while at the same time maintaining a sufficient quiescent operating current in transistors 2 and 4 for satisfactory operation. The shared emitter network comprises transistors 34 and 36 connected in tandem. The collector of transistor 34 is connected to node 24 and the base of transistor 34 is provided bias by a positive source of potential 38 through a current-limiting resistor 40. A zener diode 41, shunted between the base of transistor 34 and ground, stabilizes the operating conditions of transistor 34. The emitter of transistor 34 is connected to the collector of transistor 36 and the emitter of transistor 36 is coupled to ground through a potentiometer 42. Bias from source 38 is also applied to the base of transistor 36 by means of a voltage divider comprising a current-limiting resistor 44 and a zener diode 46, used to stabilize the operating conditions of transistor 36. A potentiometer 48 connects this source of bias to the base of transistor 36. The resistances of potentiometers 42 and 48 are varied to adjust the dynamic resistance between common node 24 and ground in accordance with Equation 8 to equalize the magnitudes of the voltage gains $K_1$ and $K_2$, and thus optimize the common-mode rejection ratio.

The circuit shown in FIG. 1 is the most general arrangement of a differential amplifier. In practice, for some applications it might be desirable to completely eliminate resistors 20 and 22. Satisfactory operation is also possible for some applications when either collector resistor 8 or 10 is eliminated.

What is claimed is:

1. An amplifier comprising a first transistor, a second transistor, said transistors being biased for amplifier operation, a first terminal connected to the base of said first transistor, a second terminal connected to the base of said second transistor, a third terminal connected to the collector of said second transistor, a collector resistor for each of said transistors, and means for optimizing common mode rejection including a common network shared by each of said transistors as part of its emitter circuit, the resistance of said common network having a value such that the voltage gain from said first terminal to said third terminal, $$K_1=\frac{R_L R_x(ar_c+r_b+R_g)(r_c+R_L)}{B(r_c+R_L+r_b+R_g)(R_x+R_e+R_o)}$$

is equal and opposite to the voltage gain from said second terminal to said third terminal, $$K_2=-\frac{R_L\left[ar_c-re-Re-\frac{R_x(R_e+R_i)}{R_x+R_e+R_i}\right]}{B}$$

where $R_L$ is the resistance of said collector resistors, $R_x$ is the resistance of said common network, $a$ is the value of the equivalent-T common-base current-amplification factor of said transistors, $r_c$ is the equivalent-T collector resistance of said transistors, $r_b$ is the equivalent-T base resistance of said transistors, $r_e$ is the equivalent-T emitter resistance of said transistors, $R_g$ is the resistance external to the base of said transistors, $R_e$ is the resistance individual and external to the emitter of each of said transistors, $$R_i=R_o=r_e+(r_b+R_g)\frac{r_c(1-a)+R_L}{r_c+R_L+r_b+R_g}$$

and $$B=(r_b+R_g)\left[r_c(1-a)+R_L+r_e+Re+\frac{R_x(R_e+R_o)}{R+R_e+R_o}\right]+(r_c+R_L)\left[r_e+Re+\frac{R_x(R_e+R_o)}{R_x+R_e+R_o}\right]$$

2. A differential amplifier comprising first and second transistors, each of said transistors being arranged in the common-emitter configuration and having substantially matched characteristics, means for optimizing common mode rejection including a circuit element forming part of the emitter circuit of both of said transistors, said element having a dynamic resistance substantially equal to $ar_c/2$ where $a$ is the equivalent-T common-base current-amplification factor and $r_c$ is the equivalent-T collector resistance of each of said transistors, and means for providing substantially equal current to each of said transistors.

3. A differential amplifier comprising first and second transistors having substantially matched characteristics, means for optimizing common mode rejection including a resistor having one terminal connected in common to the emitters of each of said transistors, the resistance of said resistor being substantially equal to $ar_c/2$ where $a$ is the equivalent-T common-base current-amplification factor and $r_c$ is the equivalent-T collector resistance of said transistors, means for providing substantially equal bias to each of said transistors for amplifier operation, a first input terminal connected to the base of said first transistor, a second input terminal connected to the base of said second transistor, and an output terminal connected to the collector of said first transistor.

4. An amplifier comprising first and second transistors having matched characteristics, the emitter terminals of said transistors being coupled together, means for optimizing common mode rejection including a circuit element connected between the emitters of said transistors and ground, the dynamic resistance of said element being substantially equal to $ar_c/2$ where $a$ is the equivalent-T common-base current-amplification factor and $r_c$ is the equivalent-T collector resistance of said transistors, and means for providing substantially equal bias to each of said transistors for amplifier operation.

5. A differential amplifier comprising first and second transistors each having a base lead and a collector lead and having substantially matched characteristics, a source of signals having two terminals, one terminal of said source being connected to the base lead of one of said transistors, a load having two terminals, one terminal of said load being connected to the collector lead of one of said transistors, one of the remainder of the aforementioned terminals being connected to one of the remainder of the aforementioned leads, the other of the remainder of the aforementioned terminals being connected to ground, means for optimizing common mode rejection including a network connected in common between the emitter of each of said transistors and ground, said network having a dynamic resistance substantially equal to $ar_c/2$ where $a$ is the equivalent-T common-base current-amplification factor and $r_c$ is the equivalent-T collector resistance of each of said transistors, and means for providing substantially equal bias to each of said transistors.

6. A differential amplifier comprising a first transistor and a second transistor, said transistors being arranged for common-emitter amplifier operation and having substantially matched characteristics, biasing means for providing substantially equal bias to said first and second transistors, a collector resistor for each of said first and means for optimizing common mode rejection including second transistors, and a network common to the emitter circuits of both of said transistors comprising third and fourth transistors connected in tandem, the collector of said third transistor being coupled to the emitters of said first and second said transistors and the emitter of said third transistor being connected to the collector of said fourth transistor, and means for biasing said third and fourth transistors such that said network possesses a dynamic resistance having a value such that the voltage gain from the base of said first transistor to the collector of said second transistor, $$K_1=\frac{R_L R_x(ar_c+r_b+R_g)(r_c+R_L)}{B(r_c+R_L+r_b+R_g)(R_x+R_e+R_o)}$$

is equal and opposite to the voltage gain from the base of said second transistor to the collector of said second transistor $$K_2 = -\frac{R_L\left[ar_c - r_e - R_o - \frac{R_x(R_e+R_i)}{R_x+R_e+R_i}\right]}{B}$$

where $R_L$ is the resistance of said collector resistors, $R_x$ is the resistance of said common network, $a$ is the value of the equivalent-T common-base current-amplification factor of said transistors, $r_c$ is the equivalent-T collector resistance of said transistors, $r_b$ is the equivalent-T base resistance of said transistors, $r_e$ is the equivalent-T emitter resistance of said transistors, $R_g$ is the resistance external to the base of said transistors, $R_e$ is the resistance individual and external to the emitter of each of said transistors.

$$R_i = R_o = r_e + (r_b + R_g)\frac{r_c(1-a)+R_L}{r_c+R_L+r_b+R_g}$$

and $$B = (r_b+R_g)\left[r_c(1-a)+R_L+r_e+R_e+\frac{R_x(R_e+R_o)}{R_x+R_e+R_o}\right] + (r_c+R_L)\left[r_e+R_e+\frac{R_x(R_e+R_o)}{R_x+R_e+R_o}\right]$$

7. A differential amplifier comprising first and second transistors, the emitters of said transistors being connected to a common point, an emitter circuit shared by said first and said second transistors and connected between said common point and ground comprising a third transistor the collector of which is connected to said common point, a first resistor, a source of bias voltage connected to the base of said third transistor through said first resistor, a zener diode connected between the base of said third transistor and ground, said zener diode being poled to maintain the zener breakdown voltage between the base of said third transistor and ground, a fourth transistor the collector of which is connected to the emitter of said third transistor, a first potentiometer connected between the emitter of said fourth transistor and ground, a second resistor and a second zener diode connected in series between said source of bias voltage and ground, a second potentiometer connected from the junction of said second resistor and said second diode to the base of said fourth transistor, said second diode being poled to maintain the zener breakdown voltage between the base of said fourth transistor and ground, said first and second potentiometers being adjusted to present a dynamic resistance between said common point and ground substantially equal to $ar_c/2$ where $a$ is the equivalent-T common-base current-amplification factor and $r_c$ is the equivalent-T collector resistance of said first and second transistors.

References Cited by the Examiner

UNITED STATES PATENTS 3,178,651 4/1965 Kegelman.

OTHER REFERENCES

Rideout: Active Networks, Prentice-Hall, 1960, pages 202–205, Sec. 7.3.

Beneteau: The Design of High Stability D.C. Amplifiers, Semiconductor Products, 2–1961, pages 27–30.

Hilbiber: A New D-C Transistor Differential Amplifier, presented at Philadelphia Solid State Circuits Conference, 2–15–1961, 11 pages.

ROY LAKE, *Primary Examiner.*

F. D. PARIS, N. KAUFMAN, *Assistant Examiners.*